United States Patent [19]

Watanabe et al.

[11] 3,974,487

[45] Aug. 10, 1976

[54] MAGNETIC BUBBLE TRANSMISSION SYSTEM

[75] Inventors: Teruji Watanabe, Niza; Hideo Ishihara, Kamakura; Norio Seki, Tokyo, all of Japan

[73] Assignee: Kokusai Denshin Denwa Kabushiki Kaisha, Japan

[22] Filed: July 8, 1974

[21] Appl. No.: 486,370

[30] Foreign Application Priority Data

July 5, 1973   Japan ............................. 48-75289
Sept. 20, 1973   Japan ............................ 48-106291

[52] U.S. Cl. ............................................. 340/174 TF
[51] Int. Cl.² ............................................ G11C 11/14
[58] Field of Search ............... 340/174 TF, 174 SR

[56] References Cited
UNITED STATES PATENTS

3,530,444   9/1970   Bobeck et al. .................. 340/174 TF
3,540,021   11/1970   Bobeck et al. .................. 340/174 TF

OTHER PUBLICATIONS

IBM Tech. Disc. Bull., "Angelfish Circuits for Cylindrical Magnetic Domains" by Almasi et al; vol. 13, No. 11, 4/71, p. 3289.

*Primary Examiner*—James W. Moffitt
*Attorney, Agent, or Firm*—Robert E. Burns; Emmanuel J. Lobato; Bruce L. Adams

[57] ABSTRACT

A magnetic bubble transmission system in which a magnetic bubble is retained in a magnetic thin plate under an appropriate bias magnetic field applied to said magnetic thin plate in a direction perpendicular thereto and in which said magnetic bubble is transmitted by reducing and restoring the intensity of the bias magnetic field. A single conductor line is disposed in close contact with the magnetic thin plate. Magnetic patterns magnetostatically coupling with the magnetic bubble are disposed along the conductor to develop at least one desired transmission path of the magnetic bubble line in such a manner that their width are monotoneously reduced at regular intervals in the desired transmission path of the magnetic bubble. The intensity of the bias magnetic field in the area extending along said conductor line is reduced and restored by a pulse current flowed in the conductor line. The transmission step of the magnetic bubble can be controlled by changing the level of the pulse current.

3 Claims, 57 Drawing Figures

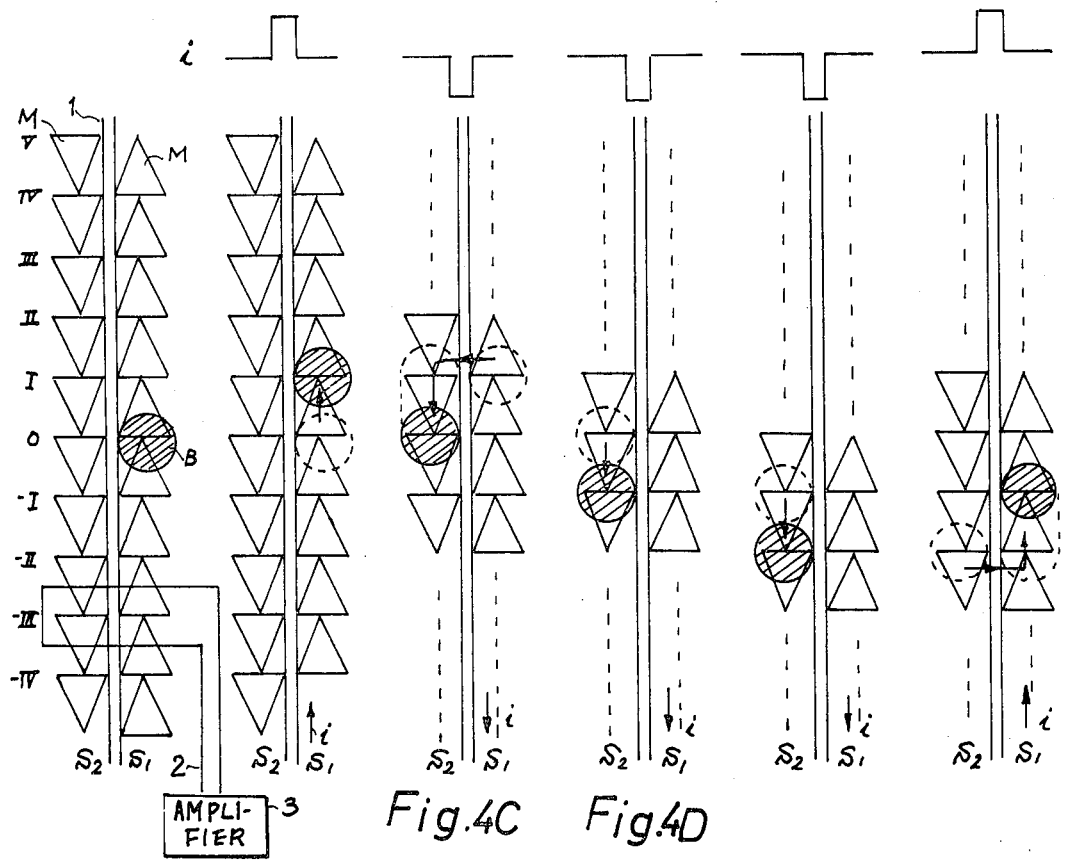
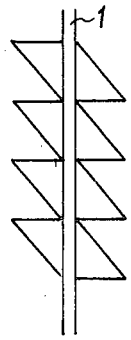
Fig.4A  Fig.4B  Fig.4C  Fig.4D  Fig.4E  Fig.4F
Fig.4G

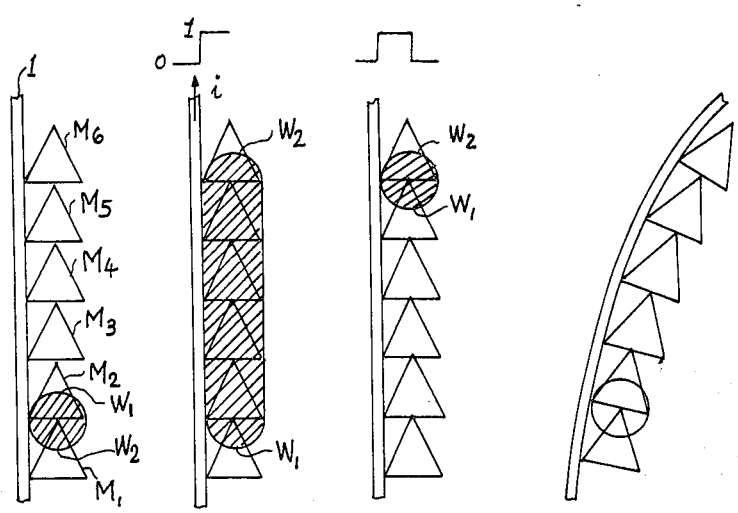
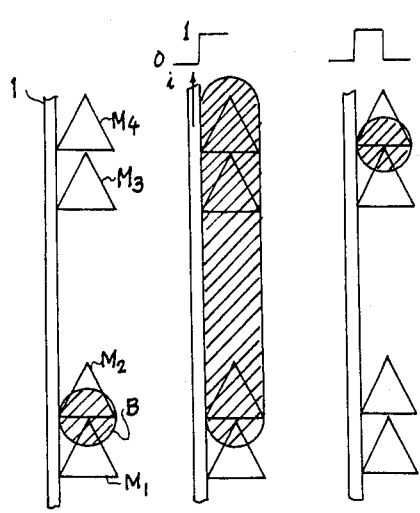
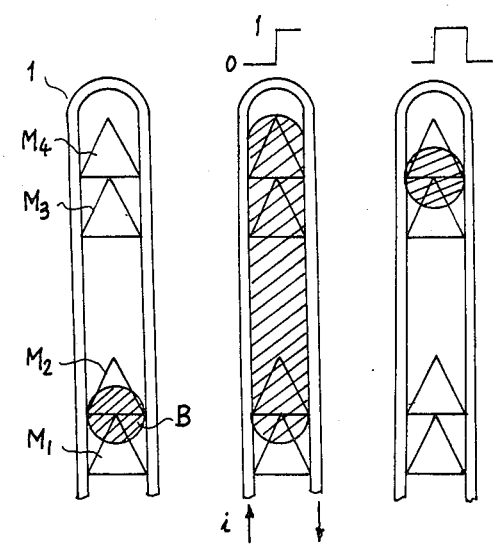
Fig.6A  Fig.6B  Fig.6C  Fig.6D
Fig.7A  Fig.7B  Fig.7C  Fig.8A  Fig.8B  Fig.8C

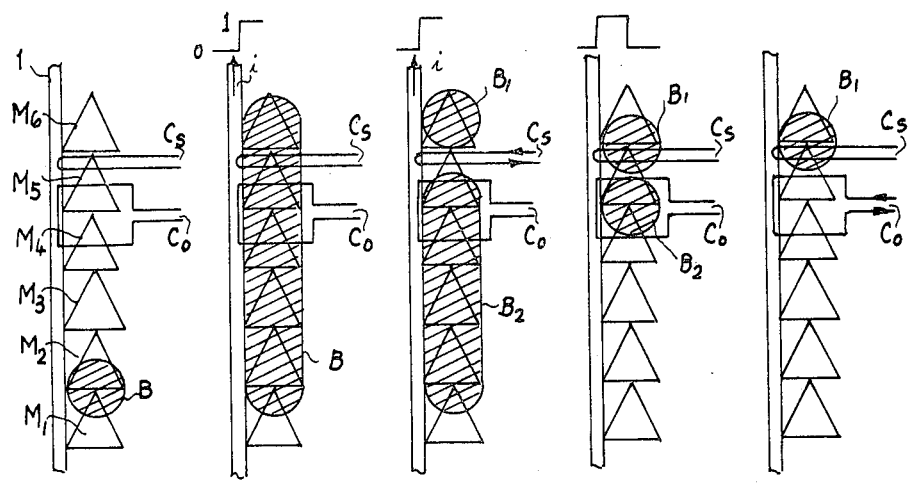
Fig.9A   Fig.9B   Fig.9C   Fig.9D   Fig.9E
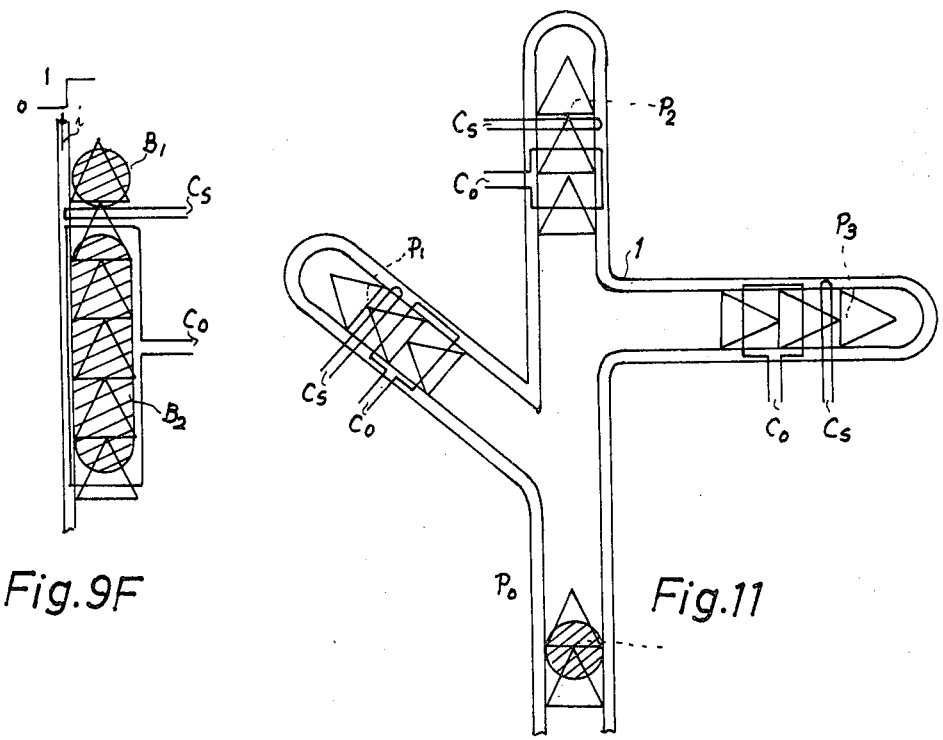
Fig.9F
Fig.11

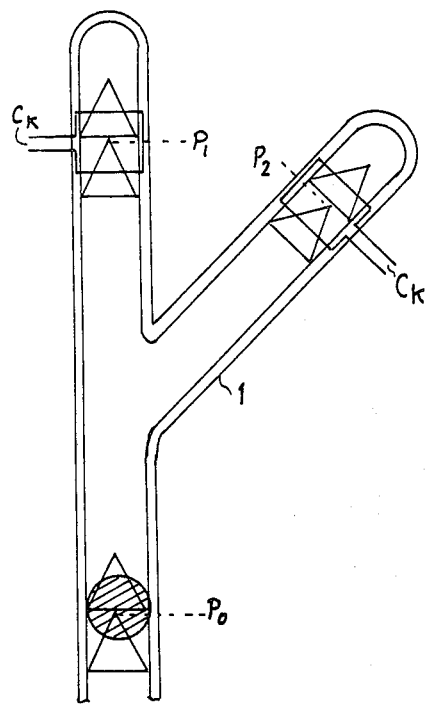
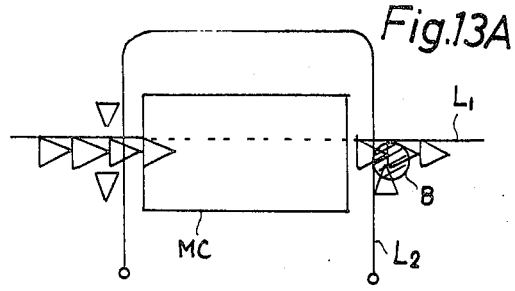
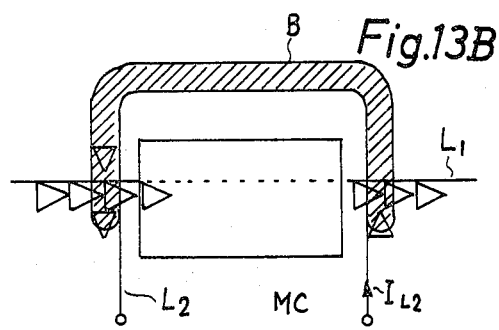
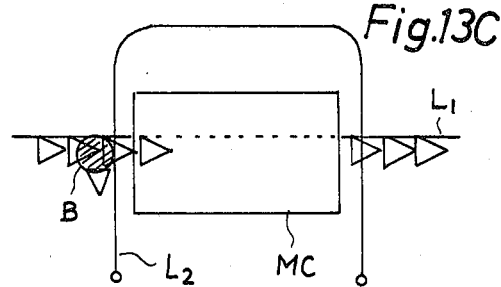
Fig.12
Fig.13A
Fig.13B
Fig.13C

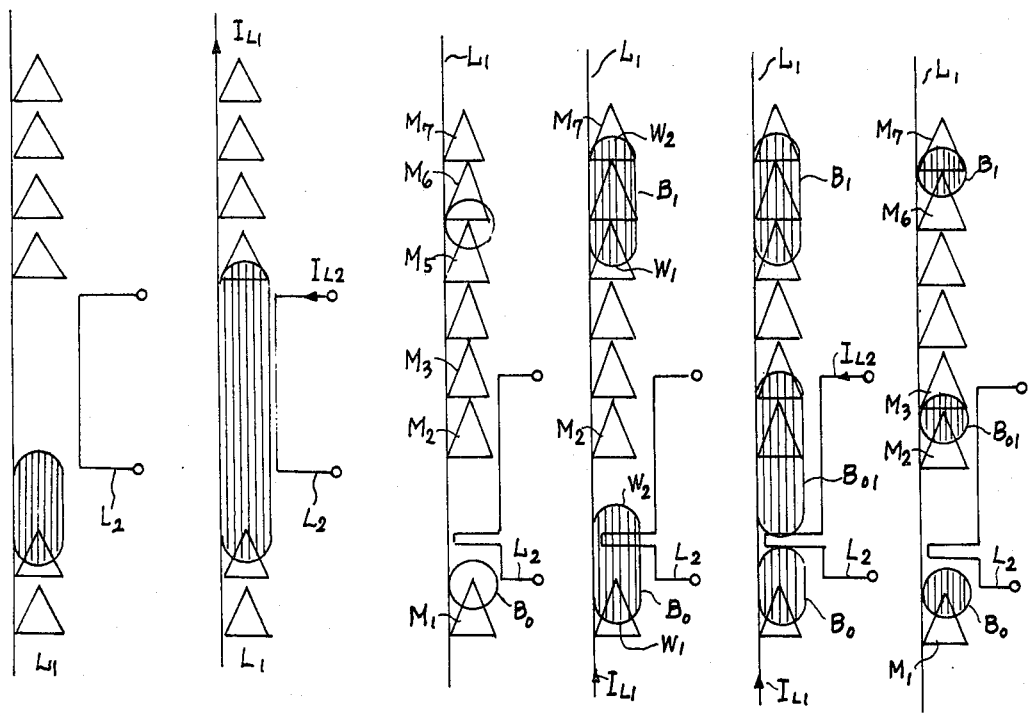
Fig.15A  Fig.15B  Fig.16A  Fig.16B  Fig.16C
Fig.16D
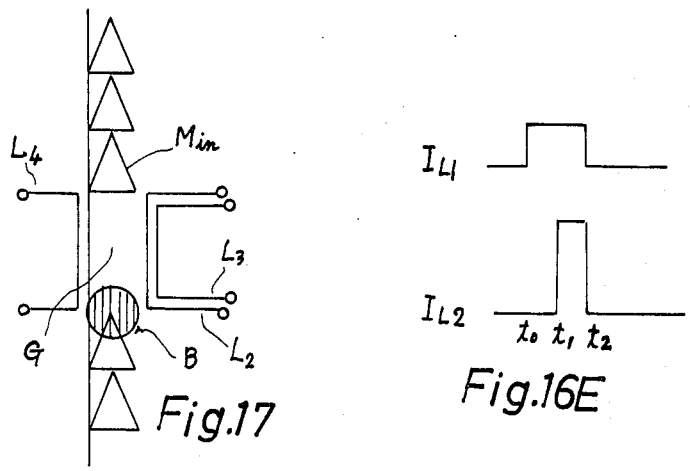
Fig.17  Fig.16E

MAGNETIC BUBBLE TRANSMISSION SYSTEM

FIELD OF THE INVENTION

This invention relates to a magnetic bubble transmission system in which cylindrical magnetic bubbles produced in a thin plate of rare earth orthoferrite, magnetic garnet, an amorphous magnetic substance or the like are shifted in the plane of the thin magnetic plate to thereby enable a variety of information processings.

BACKGROUND OF THE INVENTION

It is known in the art that when a thin plate (hereinafter referred as a magnetic thin plate) formed by a rare earth orthoferrite, a magnetic garnet, an amorphous magnetic substance or the like in such a manner that its crystal C-axis is perpendicular to the plane of the thin plate is impressed with an appropriate DC magnetic field (hereinafter referred as a bias magnetic field) in a direction perpendicular to the plane of the thin plate, cylindrical magnetic bubbles (hereinafter referred as magnetic bubbles) magnetized in a direction opposite to the bias magnetic field are produced in the magnetic thin plate. Since this magnetic bubble can be shifted in a plane in the magnetic thin plate under maintaining its cylindrical configuration by providing a gradient of the bias magnetic field at both ends of domain walls defining the magnetic bubble, it is possible to achieve memory or logical operations of information by respectively utilizing the presence and absence of the magnetic bubble as binary information 1 and 0. Various information processing circuits of this type are now produced.

Many kinds of systems have been known for transmitting a magnetic bubble in the magnetic thin plate. One of the known systems is of such a type, in which a soft-magnetic thin film of a specific form is disposed in close contact with the magnetic thin plate so that the magnetic bubble is shifted-and-transmitted in one direction by repeatedly reducing and restoring the magnitude of the bias magnetic field under a condition where the magnetic bubble is coupled with the soft magnetic thin film in a manner to minimize its magnetostatic energy.

However, the above system necessitates the use of a coil for reducing and restoring the magnitude of the bias magnetic field, so that the apparatus therefore becomes inevitably large in size as a whole. Attempting to reduce the overall size of the apparatus by applying the bias magnetic field to the magnetic thin plate under a fixed bias method using a permanent magnet or a self bias method in place of the coil, the reduction and restoration of the bias magnetic field become difficult to achieve and this system cannot be used. Further, in this system, when the bias magnetic field is reduced or restored in its magnitude, all magnetic bubbles present in the magnetic thin plate simultaneously move, so that this system is not suitable for the making of circiuts which have a higher degree of function in addition to a memory function.

SUMMARY OF THE INVENTION

An object of this invention is to provide a simple magnetic bubble transmission system in which only by flowing a single-phase pulse current in one conductor line, the magnetic bubble is shifted along the conductor line in proportion to the number of pulses applied thereto.

BRIEF DESCRIPTION OF THE DRAWINGS

The principle, construction and operations of this invention will be clearly understood from the following detailed description taken in conjunction with the accompanying drawings, in which:

FIGS. 4A to 4F and FIG. 5 are plan views illustrating other examples of this invention;

FIGS. 4G is a plan view illustrating a modification of the example shown in FIGS. 4A to 4F;

FIGS. 6A to 6D, FIGS. 7A to 7C, FIGS. 8A to 8C, FIGS. 9A to 9F, FIG. 10, FIG. 11, FIG. 12, FIGS. 13A to 13C, FIGS. 14A to 14D, FIGS. 15A and 15B, FIGS. 16A to 16D, FIG. 17, FIG. 18, and FIGS. 19A to FIG. 19E are plan views illustrating another examples of this invention; and FIG. 16E is wave form diagram explanatory of the operations of the example shown in FIGS. 16A to 16D.

DESCRIPTION OF THE PREFERRED EMBODIMENTS

Figure 1A:
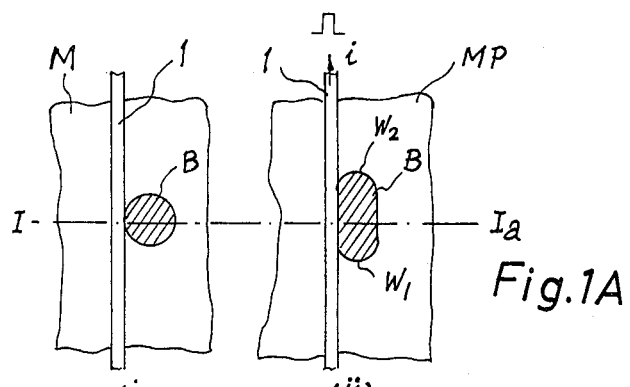
FIGS. 1A and 1B are plan views and sections explanatory of the principle of this invention.
Figure 1B:
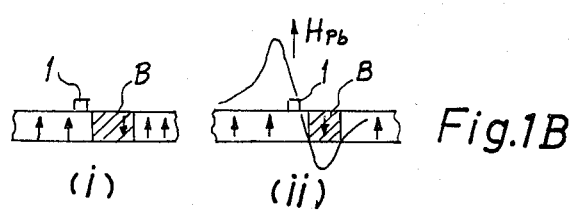
Figure 2A:
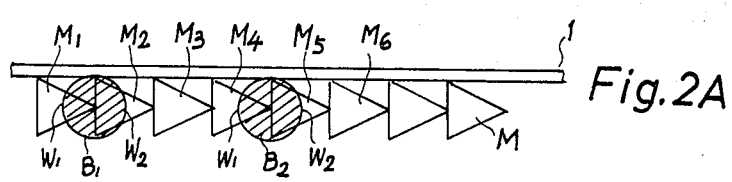
FIGS. 2A, 2B and 2C are plan views illustrating an example of this invention.
Figure 2B:
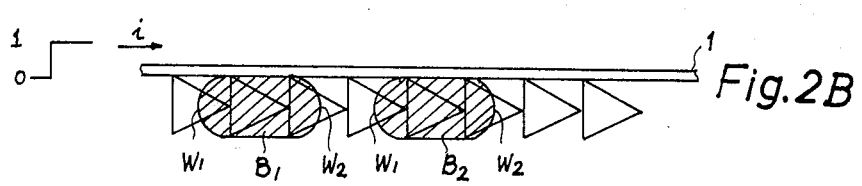

With reference to FIGS. 1A and 1B, the principles of this invention will be described. FIGS. 2(a) and 2(b) are diagrams showing the state that one magnetic bubble B exists along a conductor line 1 disposed on the magnetic thin plate MP in close contact therewith. FIGS. 1A(i) and 1B(i) shows the state in which the bias magnetic field $H_{B1}$ (not shown) is being applied to the magnetic thin plate MP and the magnetic bubble B magnetized downwardly rests along the conductor line 1 while maintaining a circular shape. FIG. 1A(ii) and FIG. 1B(ii) show the state of the magnetic bubble when a pulse current is being applied to the conductor line 1 to flow a current therein. In this case, components $H_{PB}$ of the magnetic fields produced by the conductor line 1 which is vertical to the surface plane of the magnetic thin plate are distributed as indicated by a curve in FIGS. 1B(i) and 1B(ii). As is apparent from the illustrations, a groove of a downward magnetic field is formed along the right-hand side of the conductor line 1 and, on the right-hand side of the conductor line 1, the bias magnetic field is cancelled out by the magnetic field generating from the conductor line 1 so that the bias magnetic field is reduced to a value $H_{B0}$ ($H_{B1} > H_{B0}$) equivalently. Consequently, the area of the magnetic bubble B increases due to the reduction of the bias magnetic field. However, since the aforesaid groove of the magnetic field is produced along the right-hand side of the conductor line 1, the domain wall of the magnetic bubble B hardly extends in a direction perpendicular to the conductor line 1. Moreover, only the domain walls $W_1$ and $W_2$ shown in FIG. 1A(ii) extend along the conductor line 1, so that the magnetic bubble becomes an elliptical shape. This indicates that the value of the bias magnetic field can be reduced and restored locally by the conductor line 1.

Figure 2C:
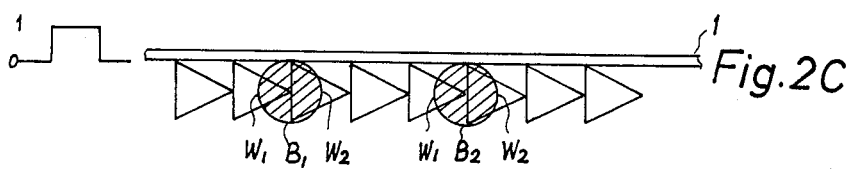

With reference to FIGS. 2A, 2B and 2C, an example of the magnetic bubble transmission system of this invention based on the above principle will be described. As shown in FIG. 2A, this system employs, as magnetic bubble transmitting means, triangular patterns M which are formed by soft-magnetic thin films and disposed on the magnetic thin plate (not shown) along the conductor line 1.

FIG. 2A shows the state in which magnetic bubbles $B_1$ and $B_2$ are coupled with the triangular patterns $M_1$, $M_2$ and $M_4$, $M_5$, respectively, along the conductor line 1 under the condition where an appropriate bias magnetic field $H_B$ (not shown) is being applied. The state in which a current $i$ is flowed in the conductor line 1 is shown in FIG. 2B. At this time, the magnitude of the bias magnetic field applied to the inside of the magnetic thin plate along the right-hand side of the conductor line 1 is reduced by the current $i$ flowing in the conductor line 1, so that the magnetic bubbles $B_1$ and $B_2$ are going to grow larger. In this case, they extend not in the direction perpendicular to the conductor line 1 but along the conductor line, as described previously with regard to FIG. 1B($ii$). However, since the triangular patterns formed by magnetic thin films exist, only the domain wall $W_2$ of each of the magnetic bubbles $B_1$ and $B_2$ extends along the conductor line 1. Then, upon cutting off the current $i$ in the conductor line 1, only the domain wall of each of the magnetic bubbles $B_1$ and $B_2$ shifts so that the magnetic bubbles rest at the positions shown in FIG. 2C.

As will be apparent from the foregoing description, this system is capable of shifting the magnetic bubble by one step of the triangular pattern by one application of the pulse current $i$ to the conductor line 1, and hence is a magnetic bubble transmission system which enables shifting the magnetic bubble by a distance proportional to the number of pulses flowed in the conductor line 1.

The triangular patterns may be disposed on the same side of the magnetic thin plate as the conductor line 1 or on the opposite side from the latter.

Figure 3A:
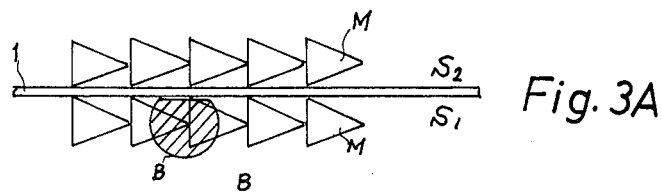
FIGS. 3A, 3B and 3C are plan views illustrating another example of this invention.
Figure 3B:
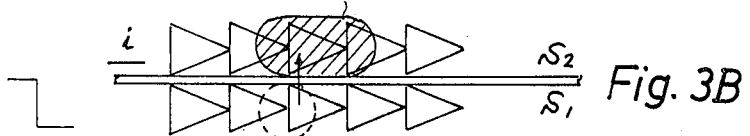
Figure 3C:
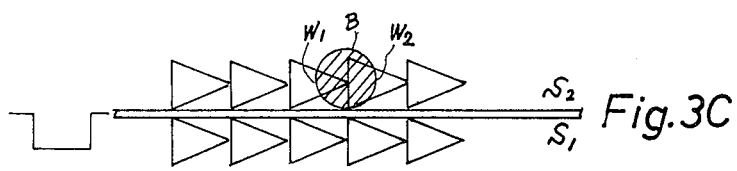

With reference to FIGS. 3A, 3B, 3C and 3D, another example of the magnetic bubble transmission system of this invention will be described. In this case, the triangular patterns M are disposed on both sides $S_1$ and $S_2$ of the conductor line 1. Let it be assumed that one magnetic bubble B exists on the side $S_1$ as shown in FIG. 3A. It has already been described in the foregoing that, upon flowing of a positive pulse current $i$ in the conductor line 1 in the above state, the magnetic bubble B shifts to the right at the side $S_1$ in proportion to the number of pulses flowed in the conductor line 1. Now, a discussion will be made in connection with the case where a negative current flows in the conductor line 1. In this case, since the magnetic field caused by the conductor line 1 is downward relative to the surface of the sheet of paper on the side $S_2$, the magnetic bubble B shifts from the side $S_1$ to the side $S_2$ across the conductor line 1 so that stands still in such an extended form as shown in FIG. 3B. Then, upon cutting off the current in the conductor line 1, the domain wall $W_2$ hardly moves while only the domain wall $W_1$ shifts in the direction that the magnetic bubble B becomes smaller, as described previously, and the magnetic bubble B stands still at such a position as shown in FIG. 3C. Namely, if a negative pulse current is flowed in the conductor line 1 in the state of FIG. 3A, the magnetic bubble B shifts across the conductor line 1, which implies that the magnetic bubble B shifts by one step of the triangular pattern M.

Figure 3D:
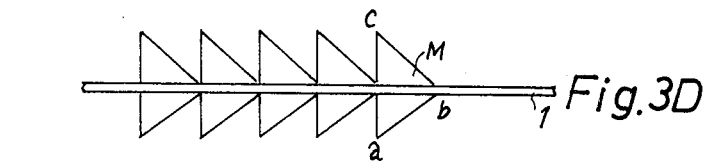
FIGS. 3D is a plan view illustrating a modification of the example shown in FIGS. 3A to 3C.

The triangular patterns may have various formations. For example, as shown in FIG. 3D, the conductor line 1 may also be disposed along the centers of triangular patterns M each having apexes $a$, $b$ and $c$.

With reference to FIGS. 4A, 4B, 4C, 4D, 4E, 4F and 4G, an embodiment of this invention, which is the so-called up-down counter for counting the difference between the numbers of positive and negative pulses contained in a pulse train, will be described. FIG. 4A shows an up-down counter constructed by disposing the triangular patterns M on both sides of the conductor line 1. One magnetic bubble B is restored at the position 0 of the counter. In this case, the magnetic bubble B stays on the side $S_1$ relative to the conductor line 1. However, even if the magnetic bubble lies on the side $S_2$, the output of the counter assumes the same state so that the output of the counter is indicated by one position in the lengthwise direction of the conductor line 1. A detection loop 2 is provided for detecting the magnetic bubble B in the lengthwise direction of the conductor line 1, for example, at a position - III at the side of $S_1$ or $S_2$. Reference numeral 3 indicates an amplifier for amplifying the output of the detection loop 2. In a case where such a positive pulse current as shown at the top of the illustration flows in the conductor line 1 in the state of FIG. 4A, the magnetic bubble B shifts upwardly by one step of the triangular pattern M on the side $S_1$ and rests at the position shown in FIG. 4B. The positions of the magnetic bubble B in the case of the negative, negative, negative and positive currents being similarly flowed are shown in FIGS. 4C, 4D, 4E and 4F. Since the operation of the magnetic bubble B has been described previously, no detailed description will be repeated. In FIG. 4F, the magnetic bubble B stays at the position - I, which is in agreement with the difference between the numbers of positive and negative pulses corresponding to two positive pulses and three negative pulses, flowed in the conductor line 1. From this, it is understood that this circuit performs the operation of an up-down counter. In this case, with the provision of the detection loop 2 at each stage, the contents of the counter at any desired time can be known at all times. Further, it is also possible that, by providing the detection loop 2 only at the position, for example, - III, of the counter as shown in FIG. 4A, this circuit is used as a threshold circuit which provides an output only when the difference between the numbers of the positive and negative pulses is equal to - 3.

In this case also, the triangular pattern M may have various formations. A form of arranging many soft-magnetic patterns of parallelogram and disposing the conductor line 1 or the diagonals of the patterns as shown in FIG. 4G, is preferred from the manufacturing point of view.

Figure 5:
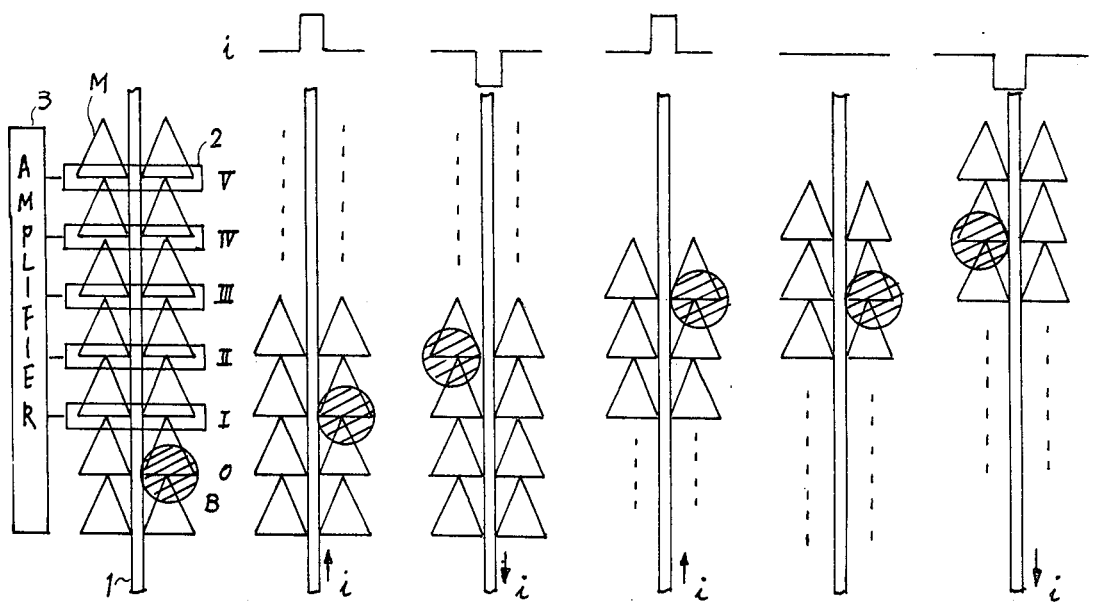

With reference to FIG. 5 a counter for counting the sum of numbers of positive and negative pulses will be described. In this case, the contents of the counter rise step by step irrespective of whether the pulse to be counted is positive or negative so that an output is obtained from the detection loops provided at each stage.

The foregoing description has been given in connection with the system in which the triangular patterns M are formed by the soft-magnetic thin films but, instead of using the soft-magnetic thin films, it is also possible to form soft-magnetic patterns by driving appropriate ions by ion implantation techniques in the magnetic thin plate in the area except those for the triangular patterns.

The shape of the soft-magnetic thin film patterns M also need not be limited specifically to the triangular one and may be such that the widths of the soft magnetic thin film patterns M are reduced uniformly at predetermined intervals in a desired transmission direction of the magnetic bubble. Therefore, a continuous pattern of, for example, trapezoids may be adopted.

As has been described in detail in the foregoing, with the magnetic bubble transmission system of this invention, it is possible to easily construct a circuit which is capable of transmitting the magnetic bubble in both positive and negative directions in the length-wise direction of the conductor line regardless of the polarity of the pulse current flowed in the conductor line and, in addition, the transmitting means disposed on the magnetic thin plate is capable of selectively transmitting only the magnetic bubble staying along the conductor line supplied with the pulses. Therefore, a magnetic bubble circuit of high information density and high-degree function can be produced with a simple construction.

With the above system, however, the magnetic bubble cannot be transmitted by different distances within the same period of time. Consequently, it is impossible with this system to construct various circuits having a large number of different functions, such as a fanout circuit of the type where the magnetic bubbles obtained at the output of one circuit on the magnetic thin plate are used as simultaneous inputs to many circuits disposed at different distances, or a feedback circuit where the magnetic bubble is transmitted without delay over a certain distance in a direction opposite to its original direction of transmission, etc.

This invention may be modified to provide a magnetic bubble transmission system in which, only by flowing a pulse current in one conductor line to meet with a distance of transmission, magnetic bubbles are shifted-and-transmitted along the conductor line by a distance proportional to the level of the pulse current at a desired time, making it possible to easily realize a high-speed fanout circuit, a threshold circuit, an A–D converter, etc. FIG. 6A shows the state in which the magnetic bubble B exists along the conductor line 1 in captivity by triangular patterns $M_1$ and $M_2$ of magnetic thin film under an appropriate bias magnetic field $H_B$ (not shown). Namely, patterns ($M_1$ to $M_6$) of a magnetic material, which are magnetostatically coupled with the magnetic bubble B, are arranged along the one side of the conductor line 1 in such a manner that their widths are monotonously reduced in a desired transmission direction of the magnetic bubble B in an upward direction in the illustration in this case at desired capturing positions of magnetic bubble. In this case, the capturing position of magnetic bubble is the position of the vertex of each triangular pattern. FIG. 6B shows a state in which a current $i$ is flowed in the conductor line 1. At this time, the intensity of the bias magnetic field applied to the inside of the magnetic thin plate along the right-hand side of the conductor line 1 becomes low, so that the magnetic bubble B extends along the conductor line 1. In addition, since the triangular patterns formed by a soft-magnetic material exist, only the domain wall $W_2$ of the magnetic bubble B moves along the conductor line 1. Then, upon removal of the current $i$ flowing in the conductor line 1, the side of the domain wall $W_1$ shrinks as shown in FIG. 6C. The distance of travel can be changed at will by changing the level of the pulse current $i$. Further, the conductor line 1 need not always be straight but may be curved as shown in FIG. 6D, allowing a high degree of freedom in the construction of circuits.

In a case where the distance of transmission is fixed, there is no need of providing any triangular patterns in the transmission line except at both ends thereof, as illustrated in FIG. 7A. If the pulse current has such a value that the magnetic bubble B extends over the triangular pattern $M_4$ as shown in FIG. 7B, the magnetic bubble rests at such a position where it is coupled with the triangular patterns $M_3$ and $M_4$ as illustrated in FIG. 7C. This allows a degree of freedom in setting of the current value. Further, the circuit shown in FIG. 7C also serves as a threshold circuit which does not provide any output unless the level of the applied current is larger than a certain value.

Moveover, with the provision of a looplike conductor line 1 along the both sides of the triangular patterns as shown in FIGS. 8A, 8B and 8C, it is also possible to transmit the magnetic bubble on the same principle as in the case of FIGS. 6A, 6B, 6C and 6D.

FIGS. 9A, 9B, 9C, 9D and 9E 9 illustrate a system for dividing the magnetic bubble at a desired position during transmission. With this system, it is possible to shorten a time necessary for the transmission of the magnetic bubble. Namely, in FIGS. 6A to 8C, the time necessary for the transmission of the magnetic bubble is considered to be the sum of the times required for the extension and shrinkage of the magnetic bubble over the distance of transmission. Accordingly, in FIGS. 9A to 9E, the magnetic bubble is divided when it has extended over the distance of its transmission so that the time necessary for shrinkage of the magnetic bubble B is omitted, thereby cutting down the time necessary for the magnetic bubble transmission.

At first, in FIG. 9A, the magnetic bubble B rests in captivity by the triangular patterns $M_1$ and $M_2$. Then, as shown in FIG. 9B, upon flowing a pulse current of a certain level in the conductor line 1, the magnetic bubble B extends to the triangular pattern $M_6$. At this time, by applying a current $i$ to a magnetic bubble dividing coil $C_s$ in such a direction as to intensify the bias magnetic field, the magnetic bubble B is divided into magnetic bubbles $B_1$ and $B_2$, as shown in FIG. 9C. Upon cutting off the pulse current $i$ flowing in the conductor line 1 in such a state, the magnetic bubble $B_2$ shrinks to be coupled with the triangular patterns $M_4$ and $M_5$ and rests there, as shown in FIG. 9D. FIG. 9E shows the state in which the magnetic bubble $B_2$ has been erased by applying to a magnetic bubble erasing coil $C_0$ provided at the position of the magnetic bubble $B_2$ a current of a magnitude large enough to erase the magnetic bubble in such a direction as to intensify the bias magnetic field. In this case, the magnetic bubble $B_1$ thus transmitted is controlled by another conductor line different from that the conductor 1 and, if the time necessary for dividing the magnetic bubble is sufficiently shorter than that for shrinkage of the magnetic bubble, the time for transmitting the magnetic bubble is cut down by the time for shrinkage of the magnetic bubble. Further, by disposing the erasing coil $C_0$ as shown in FIG. 9F, the magnetic bubble $B_2$ unnecessary for the transmission of information can be erased immediately after divided, so that the time for erasing the magnetic bubble $B_2$ can be shortened by the time for shrinkage of the magnetic bubble $B_2$.

Figure 10:
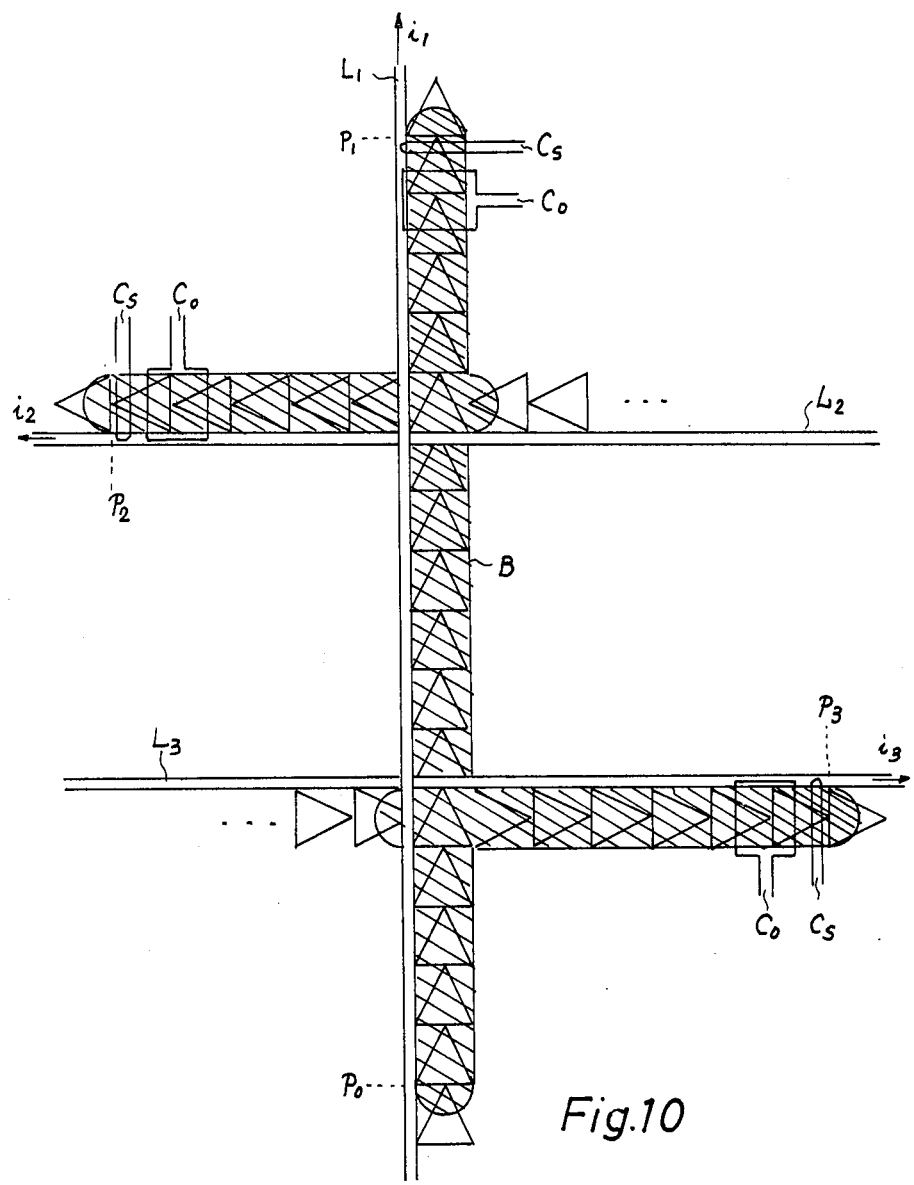

FIG. 10 shows a so-called fan out circuit in such a state that when the magnetic bubble first held at a standstill at a position $P_0$ has extended to a desired position $P_1$ due to flowing of a current $i_1$ in the conductor line $L_1$, currents $i_2$ and $i_3$ are flowed in conductor lines $L_2$ and $L_3$, respectively. Further, the magnetic bubble is divided by flowing currents to dividing coils $C_s$ of the conductors in such a direction as to intensify the bias magnetic field and, after cutting off the currents $i_1$, $i_2$ and $i_3$, the unnecessary magnetic bubbles are erased by erasing coils $C_0$, by which the magnetic bubble can be transmitted in a divided form from its original position to the positions $P_1$, $P_2$ and $P_3$, respectively.

FIG. 11 shows an example of the magnetic bubble circuit of FIGS. 8A to 8F applied to a fanout circuit. By flowing a current of a sufficient level in the conductor line 1, the magnetic bubble extends along the inside of the conductor line 1 and, by dividing the magnetic bubble with the dividing coil $C_S$, the magnetic bubble can be transmitted in a divided form from its original position $P_0$ to the positions $P_1$, $P_2$ and $P_3$.

FIG. 12 shows a system in which when the magnetic bubble has extended to desired positions $P_1$ and $P_2$ from its initial position $P_0$, a current $I_k$ (not shown) is flowed to magnetic bubble retaining coils $C_k$ in a direction to intensify the bias magnetic field and, at the same time, a current $I_L$ (not shown), which has a value large enough to erase the magnetic bubble in the areas except the magnetic bubble retaining coils $C_R$, is flowed in the conductor line I in such a direction as to intensify the bias magnetic field in the conductor line 1, thereby to retain only the magnetic bubbles at the desired positions $P_1$ and $P_2$. In this case, it is necessary to select the levels of the currents $I_L$ and $I_k$ such that the magnetic fields in the magnetic bubble retaining coils $C_k$ may exceed the magnetic field outside of the conductor line 1. Further, it is possible to construct a fan-out circuit only by providing magnetic bubble detectors at the positions of the magnetic bubble retaining coils $C_k$ in place of the latter in FIG. 11. Namely, when the magnetic bubble has reached desired positions, outputs are derived from the magnetic bubble detectors, after which a current large enough to erase the magnetic bubble is flowed in the conductor line 1, thus keeping the transmission line open for the next input.

FIGS. 13A, 13B and 13C illustrate another example of this invention applied to a magnetic bubble feedback circuit.

FIG. 13A shows the state in which the magnetic bubble B stays at the output position of a magnetic bubble circuit MC which is driven by a singleporality pulse current of a constant level which is flowed in a conductor line $L_1$. FIG. 13B shows the state in which a current of large level is flowed in a conductor line $L_2$ in the above state. In this case, if the current flowed in the conductor line $L_2$ is set at such a level that the magnetic bubble may extend by a distance equal to the length of the conductor line disposed between the input and output of the magnetic bubble circuit CM, the magnetic bubble B extends along the conductor line $L_2$, as is apparent from the description given by the principle of this invention, and reaches to the input position of the magnetic bubble circuit MC as shown in FIG. 13B. Then, upon cutting off the current $I_{L2}$ flowed in the conductor line $L_2$, the magnetic bubble B is converged to the input position as shown in FIG. 13C. Accordingly, with this circuit, the magnetic bubble can be fed back from the output position to the input position at high speed by one pulse current flowed in the conductor line $L_2$. Consequently, by flowing the pulse current in the conductor line $L_2$ in synchronism with the pulse current flowed in the conductor line $L_1$, it is possible to easily achieve, at the input position of the magnetic bubble circuit, a logical operation of the magnetic bubble staying at the input position and that transmitted along the conductor line $L_1$ and a rewriting operation of binary information represented by the presence and absence of the magnetic bubble.

FIGS. 14A to 14D and 15A, 15B show other examples of this invention, which are novel magnetic bubble circuits employing both a system of transmitting the magnetic bubble in proportion to the number of pulse currents of a constant amplitude and a system of transmitting the magnetic bubble over a desired distance in accordance with the level of each pulse current.

Figures 14A, 14B, 14C, 14D:
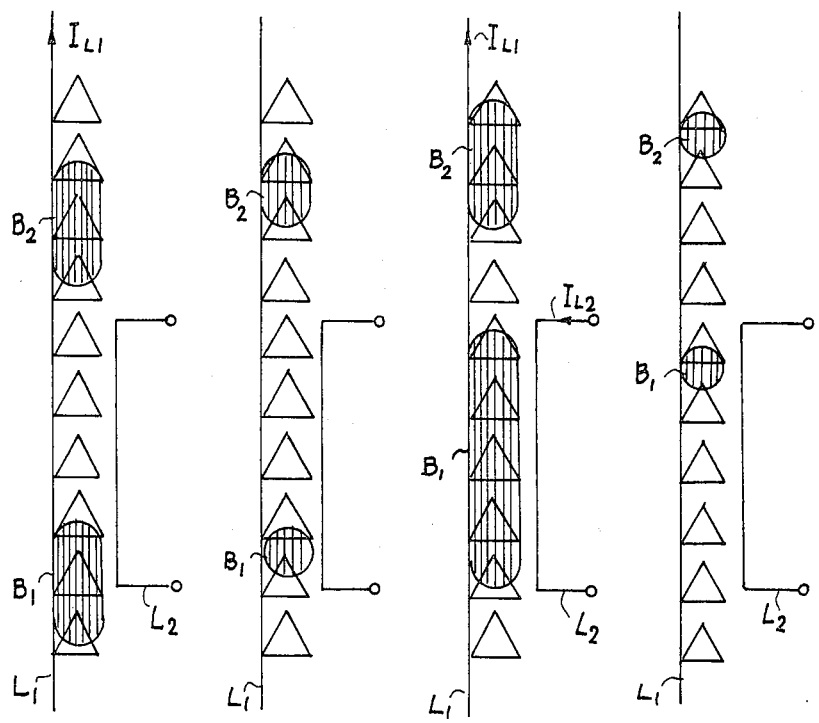

FIG. 14A shows the state in which only a constant level current $I_{L1}$ is flowing in a conductor line $L_1$ and FIG. 14B the state in which the current has been cut off. In this case, as will be seen from the foregoing description, magnetic bubbles $B_1$ and $B_2$ shift along the conductor line $L_1$ by one step of the triangular pattern. The state in which a current $I_{L2}$ is flowed in a conductor line $L_2$ in addition to the conductor line $L_1$ is shown in FIG. 14C. In this case, the magnetic bubble $B_1$ staying in the region where the conductor lines $L_1$ and $L_2$ are opposite to each other extends long under the influence of great reduction of the magnitude of the bias magnetic field. Consequently, after the current flowing in the conductor line is cut off, the magnetic bubbles $B_2$ and $B_1$ stay at such position as shown in FIG. 14D after having shifted by one step and three steps of the triangular pattern respectively. Further, it is also possible to transmit only the magnetic bubble $B_1$ by flowing the current only to the conductor line $L_2$. Accordingly, the use of this circuit allows ease in rewriting of a train of information and feedback and feedforward operations.

FIGS. 14A and 14B shows a threshold circuit or a logical operation circuit which is another example of this invention.

FIG. 14A shows the state in which the constant-level current $I_{L1}$ is flowed only in the conductor line $L_1$ when the magnetic bubble B is coupled with the triangular pattern $M_2$ only. In this circuit, no triangular pattern is provided along the conductor line $L_1$ in the area where the conductor line $I_{L1}$ is disposed, so that the magnetic bubble B cannot go ahead as is apparent from FIG. 15A. Further, even if a current is flowed only in the conductor line $L_2$ when the magnetic bubble B is circular and rests in captivity only by the triangular pattern $M_2$, the magnetic bubble B cannot be moved forward. In this circuit, as is seen from FIG. 15B, the magnetic bubble can be moved forward only in the case of flowing currents in the conductor lines $L_1$ and $L_2$ at the same time. Thus, a logical operation circuit is realized. In such a case, even if the currents $I_{Li}$ and $I_{L2}$ are simultaneously flowed, the magnetic bubble cannot be moved forward unless the current $I_{L2}$ flowed in the conductor $L_2$ exceeds a certain value, so that this circuit also performs the function of a threshold circuit and can be used as a gate circuit or the like.

FIGS. 16A to 16D illustrates another example of this invention applied to a train-of-information generator.

FIG. 16A shows the state in which no current is flowed in the conductor lines $L_1$ and $L_2$. In this case, a seed magnetic bubble $B_0$ and a magnetic bubble $Bk_1$ indicative of written information exist along the conductor line $L_1$. FIG. 16B shows the state in which a current is flowed only in the conductor line $L_1$. This state corresponds to the time interval between the time $t_0$ and the time $t_1$ in the current waveform diagram shown in FIG. 16E. At this time, if the value of the current $I_{L1}$ is set such that the magnetic bubbles $B_0$ and $B_1$ extend by a distance corresponding to one triangular pattern, respectively, the domain wall $W_2$ of the magnetic bubble $B_1$ reaches the triangular pattern $M_7$ but the seed magnetic pattern does not reach the triangular pattern $M_2$. Then, upon flowing a current $I_{L2}$ of sufficiently large magnitude in the conductor line $L_2$ (between the time $t_1$ and the time $t_2$ in the current waveform diagram in FIG. 16E), magnetic fields are applied in such directions as to extend and shrink the magnetic bubble outside and inside of the loop of the conductor line $L_2$, respectively, by which the magnetic bubble $B_0$ is divided into two magnetic bubbles $B_0$ and $B_{01}$ as shown in FIG. 16C. When the currents flowing in the conductor lines $L_1$ and $L_2$ are cut off, the magnetic bubble $B_0$ is coupled with the triangular pattern $M_1$ and remains as a seed magnetic bubble, while the magnetic bubble $B_{01}$ newly produced is coupled with the triangular patterns $M_2$ and $M_3$ and rests there so that the magnetic bubble $B_1$ is coupled with the triangular patterns $M_6$ and $M_7$ and stands still there. As will be apparent from a comparison of FIGS. 16A with FIG. 16D, in this circuit, the magnetic bubbles staying along the conductor line $L_1$ are shifted by the distance corresponding to one triangular pattern at every flowing of the current. $I_{L1}$ and, even if a new magnetic bubble is produced, transmission is not disturbed.

FIG. 17 shows another example of this invention, which is a fanin circuit or an OR circuit. Namely, even if a current in flowed in any of conductor lines $L_1$, $L_2$, $L_3$ and $L_4$, the magnetic bubble B goes ahead in jumping over a gap G, so that this circuit can be employed as a fanin circuit for applying the output of a desired circuit to another circuit.

Figure 18:
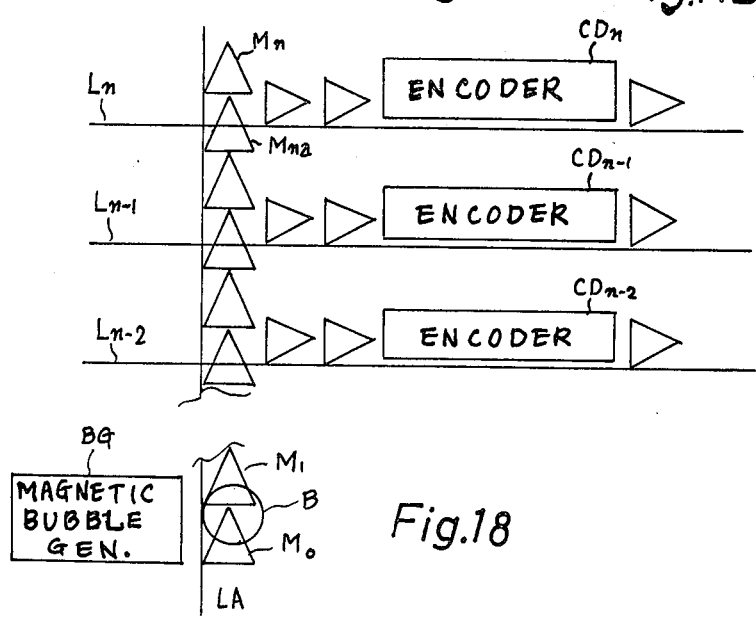

FIG. 18 illustrates another example of this invention, which is a circuit for converting an analog signal into a binary signal. In the illustration, a conductor line $L_A$ is one in which a pulse amplitude-modulated current is flowed. The operation of this circuit starts with generation of one magnetic bubble B by a magnetic bubble generator BG, which magnitude bubble is placed at a base position where it is coupled with triangular patterns $M_0$ and $M_1$. Upon flowing a pulse amplitude-modulated current $I_{LAn}$ in the conductor line $L_A$, the magnetic bubble extends by a distance dependent upon the magnitude of the pulse amplitude-modulated current $I_{LAn}$ and rests in captivity by triangular patterns, for example, Mn and $M_{na}$. Then, the magnetic bubble is applied to an encoder $CD_n$ by flowing a pulse current in a conductor line $L_n$. The encoder $CD_n$ is adapted to produce a binary code unit corresponding to the pulse amplitude-modulated current $I_{LAn}$ while dividing the magnetic bubble during the passage therethrough of the magnetic bubble. Accordingly, assuming that the pulse amplitude-modulated current $I_{LAn}$ is a current whose magnitude of, for example, 10 in a decimal value, a magnetic bubble train "1010" is obtained from the instant of completion of the passage of the magnetic bubble through the encoder $CD_n$. Of course, the encoders $CD_n$, $CD_{n-1}$, . . . may be those which produce any code units, so that this circuit is also useful as a code converter.

FIGS. 19A to 19E illustrates another example of this invention, which is an adder-subtractor circuit of an analog value.

In the adder-subtractor circuit, triangular patterns are disposed on both sides of a conductor line 1 as shown and the contents of the adder-subtractor circuit are indicated by the position of the magnetic bubble B.

Figures 19A, 19B, 19C, 19D, 19E:
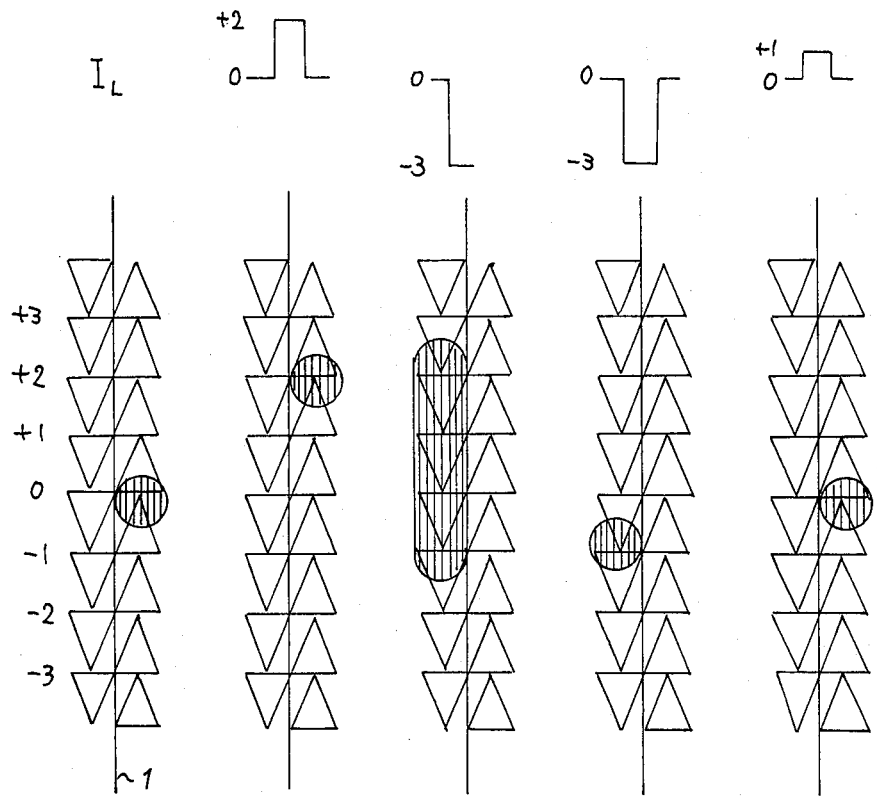

In FIG. 19A, the magnetic bubble B stand still at the position 0. The state which is subsequent to the flowing of a pulse current of a level 2 in the conductor line 1 in the positive direction is shown in FIG. 19B. The state in which a current of a level 3 is flowing in the conductor line 1 in the negative direction is shown in FIG. 19C. At this time, the magnetic bubble B shifts to the left-hand side of the conductor line 1. Then, upon cutting off of the current flowing in the conductor line 1, the magnetic bubble B stands still at the position "−1" as illustrated in FIG. 19D. The state in which a pulse current of an amplitude 1 is flowed in the conductor line 1 in the positive direction is shown in FIG. 19E. In this case, the magnetic bubble B shifts to the right-hand side of the conductor line and rests at the position /O. Consequently, this circuit has performed an additive-subtractive operation that $(+ 2 - 3 + 1 = 0 )$. The above has described that the distance of shift of the magnetic bubble is in direct-proportion to the level of the current used but, in practice, the extension of the magnetic bubble is a tangent function with respect to the current value, so that it is difficult to effect an operation of a current of large level.

As has been described in detail in the foregoing, with the present invention, the magnetic bubble can be transmitted over desired distances by changing the level of the pulse current flowed in the conductor line, so that various function circuits can be produced by utilizing the above fact and a high-density magnetic bubble circuit can be obtained with a simple construction. Thus, this invention is very useful from the industrial point of view.

What we claim is:

1. A magnetic bubble transmission system comprising:
   a magnetic thin plate for causing therein at least one magnetic bubble;
   bias means for applying a bias magnetic field to said magnetic thin plate in a direction perpendicular to the surface thereof;
   a single conductor line disposed in close contact with said magnetic thin plate;
   magnetic patterns disposed along opposite sides of said single conductor line to respectively develop two desired transmission paths of said magnetic bubble controlled by said single conductor line free of guide rails and disposed in such a manner that said transmission paths controlled by said single conductor are not enclosed by said single conductor, the widths of said magnetic patterns being monotoneously reduced at regular intervals in the desired transmission path of said magnetic bubble, only a side edge part of each of said magnetic patterns being in electrical contact with said single conductor line; and control means connected to said single conductor line for applying pulses into said single conductor line for reducing and restoring the intensity of said bias magnetic field in the area extending along said single conductor line to advance the bubble and for transferring said bubble between the transmission paths to a transmission path corresponding to the polarity of the pulses applied.

2. A magnetic bubble transmission system according to claim 1, in which said control means applies to said control line pulses of the same level to shift said magnetic bubble by the same distance.

3. A magnetic bubble transmission system according to claim 1, in which said control means applies to said control line pulses of different levels to shift said magnetic bubbles by different distances.

* * * * *